PRINTED CIRCUIT INDUCTOR

Filed Oct. 5, 1967 2 Sheets-Sheet 1

INVENTOR.
EDWARD L. RICH III
BY Bosworth, Sessions
Herrstrom & Cain
ATTORNEYS.

Dec. 16, 1969 E. L. RICH III 3,484,731

PRINTED CIRCUIT INDUCTOR

Filed Oct. 5, 1967 2 Sheets-Sheet 2

INVENTOR.
EDWARD L. RICH III
BY Bosworth, Sessions
Herrstrom & Cain
ATTORNEYS.

United States Patent Office 3,484,731

Patented Dec. 16, 1969

3,484,731

PRINTED CIRCUIT INDUCTOR

Edward L. Rich III, 5105 Roland Ave., Baltimore, Md. 21210

Filed Oct. 5, 1967, Ser. No. 673,067
Int. Cl. H01f *5/00, 27/28*
U.S. Cl. 336—200 3 Claims

ABSTRACT OF THE DISCLOSURE

Printed circuit inductors are formed as spirals on flexible insulation. The spirals are insulated by a layer of material except at the center dot of the spiral. Connections between spirals are made by folding the flexible insulation to provide contact between central dots.

Printed circuit inductors are well known in the art. For example, Wales, Jr. Patent, 2,911,605 tends to show a method for producing printed circuit inductors bearing some similarity to the subject invention. The known types of printed circuit inductors, however, require relatively bulky interconnecting tabs between successive windings and are not particularly adapted to being formed into transformers.

It is an object of this invention to provide an improved and a method for making such inductor.

It is a further object of this invention to provide an improved inductor.

Another object of this invention is to provide an improved method for making a printed circuit transformer.

A still further object of this invention is to provide an improved printed circuit transformer.

Briefly, in accordance with aspects of this invention, a printed circuit inductor is formed as a spiral of conducting material on a backing of flexible non-conducting material such as Mylar. Mylar is a water-repellent film of polyethylene terepthalate resin characterized by outstanding strength, electrical properties, and chemical inertness. Other materials, such as a polyimide film could be employed.

Preferably, the pattern comprises a series of spirals each of which constitutes a winding of the inductor. The spirals are also preferably aligned with their axes lying on a common line such that the backing can be readily folded so that the windings will have their centers lying in a common line through the flexible backing. The pattern may alternatively be a pattern of any spiraling plane geometric shape which constitutes a winding.

These windings are formed in interconnected pairs extending longitudinally of a strip of non-conductive backing and each of the windings, with the exception of the central dot, is coated with insulating material. Adjacent pairs of inductor windings are connected together by folding the flexible nonconducting backing to bring the conducting dots into contact and induction welding these dots together such that the current flow from one winding to the next is in conformity with transformer principles. Advantageously, this method may include any convenient circuit printing techniques such as the steps of applying a layer of conducting material to the flexible nonconducting backing, applying a photosensitive or other sensitized resist to the conductor, exposing the inductor winding pattern desired to be produced and developing the pattern, etching the unexposed resist and the area of conductor beneath same, and insulating the exposed conductor with the exception of a small central portion or area.

After the major portion of the conductor is insulated, the flexible backing is folded such that at least one winding of each pair is juxtaposed and coaxial with another winding of another pair and exposed central portions, dots or areas of successive windings are contiguous. While the successive pairs of windings are held in this folded position, they are connected together by suitable means such as by welding the exposed contiguous portions. In one illustrative method of welding, inductive type electrodes are placed on opposite sides of the folded insulated backing and alternating current is passed through these electrodes for a short interval such that induced currents in the contiguous conducting portions will cause these portions to be fused together or connected. After successive pairs of windings are connected together by the welding step, and the flexible backing folded into a compact form, terminals are applied to the central dots on the opposite ends of the interconnected windings and the package can now be encapsulated such as by heating, until the backing fuses together. Alternatively, the inductor might be encapsulated by any other technique.

In accordance with other aspects of this invention, a printed circuit transformer may be formed by producing a first series of aligned spiral windings on a flexible backing and a second series of aligned windings positioned with their axes lying on a line parallel to the first series. After the spiral inductors are formed, all except the central dot of the respective spirals is insulated and the flexible backing is folded to produce folds between each pair of related windings in the respective series. The exposed, contiguous central dots are connected together such as by welding. The first and second series are now brought into juxtaposition by folding the backing along a line parallel to and intermediate the axes of the first and second series of spirals so that the two series will be separated by two layers of flexible backing but will lie in adjacent parallel planes. After this folding step, the entire strip may be folded along the lines transverse to the center lines and bisecting each pair of windings of each series. It is understood, however, that terminals are provided on the first and last winding, i.e. the terminal spirals, of each series to provide the necessary number of transformer terminals. With this arrangement, transformer action can be obtained while the windings will remain isolated by the interposed layers of flexible backing.

Still further objects and advantages relate to structural details and novel combinations and arrangements of parts which will become apparent as the description proceeds. This description is made in connection with the accompanying drawing forming a part of the specification. Like parts throughout the several views are indicated by the same references.

Figure 1:
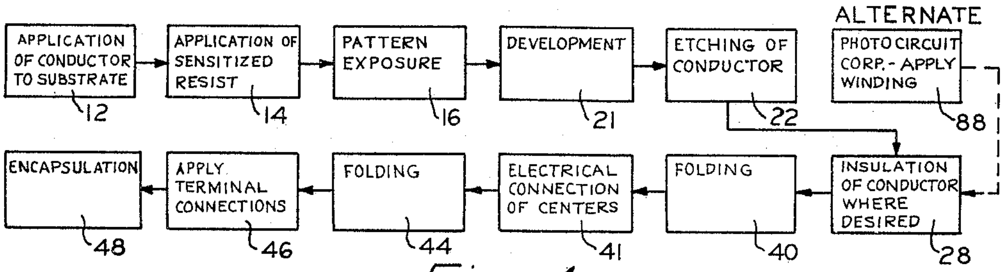
FIG. 1 is a block diagram of one illustrative method employed in this invention.
Figure 2:
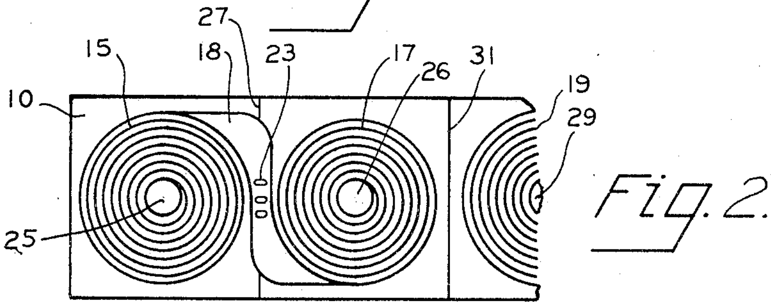
FIG. 2 is a fragmentary plan view of a portion of a printed circuit inductor according to one illustrative embodiment of this invention.

Referring now to the drawing, FIG. 1 shows a sequence block diagram of one method for producing one illustrative inductor of the type shown in FIG. 2 which may be produced on an elongated nonconducting backing 10 which is preferably a relatively thin and flexible plastic strip, such as Mylar. In employing this strip, a suitable conducting material such as copper is applied in a very thin layer over at least one surface of the strip 10 indicated on block 12 of FIG. 1 as being the first step of method of producing this inductor. After the conducting layer is applied, it is coated with a suitable resist as indicated by block 14 of FIG. 1 and a suitable pattern is then exposed on the resist. Preferably, the pattern is in the form of pairs of spirals, such as a first and a second spiral 15 and 17, respectively of FIG. 2 and only a portion of another pair of spirals, namely spiral 19, is shown in the embodiment of FIG. 2, each spiral of the pair is connected by a broader band of conducting material shown as 18, FIG. 2, extending over the area between spirals of a connected pair, connecting same where the fold is to be made later. After the pattern is exposed as indicated by block 16 of FIG. 1, the exposed pattern is developed as indicated by block 21 of FIG. 1 and the undeveloped portion is etched away as indicated by the block 22. After etching step, the remaining portion of the conductor corresponds to the spirals 15, and 17 on the strip 10, FIG. 2, connected by means of a relatively wide connector strip 18. Between the pair of coils, or spirals 15 and 17, the strip 18 is provided with suitable holes, such as elliptical holes 23, to facilitate the bending of the conducting strip 18 along a line preferably transverse to the line through the central dots 25, 26 of the coils 15, 17 respectively, and to terminate any crack that might emanate in the conductor material.

Figure 5:
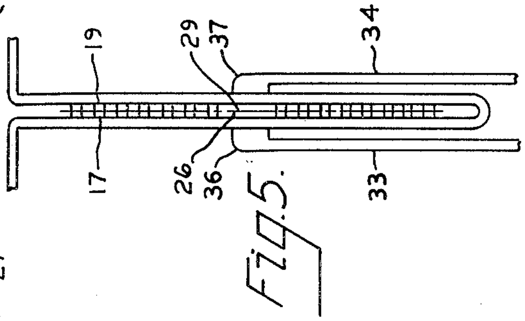
FIG. 5 is a fragmentary view in section, to a greatly enlarged scale relative to that of the scale of FIGS. 2, 3 and 4, showing one illustrative method of joining successive windings.

The next step in this method is to insulate each of the windings with the exception of the central dot, such as the dots 25, 26 as indicated by the block 28 of FIG. 1. After the step of insulating, all except the central dots of the series of windings, or spirals; the flexible backing 10 is folded along the transverse lines, such as the line 31 between windings 17, 19. With only the transverse lines intermediate a pair of winding folded, the windings are juxtaposed as indicated in FIG. 5. This folding is produced between successive pairs of windings on the flexible backing. For example, in FIG. 5, it is assumed that the fold is made along the line 31 of FIG. 2 to produce the winding 19 juxtaposed the winding 17 with the central dot 26 touching the central dot 29. With the flexible backing 10 in this position, a pair of induction electrodes 33, 34, FIG. 5, are positioned with their centers 36, 37 on opposite sides of the fold and aligned with the center dots 26, 29, FIG. 2. A suitable alternating current is now applied to the electrodes 33, 34 for a brief interval of time inducing hysteresis currents in and between the central dots 26, 29, FIG. 2 or FIG. 5, thus welding these central dots together. Thus the winding 19 is connected to the winding 17. This welding may be achieved with sufficient power to make a proper contact. This welding step is repeated for each successive fold between terminal windings, such as 17, 19, FIG. 2 and FIG. 5, of adjacent pairs. Stated in another manner, if an inward fold is made between each pair of windings, each dot of one pair of windings will be adjacent a dot of the next adjacent windings such that the windings are contiguous at their centers and are serially connected. These steps of folding along the transverse lines and welding of the center dots of adjacent windings are indicated by blocks 40 and 41, respectively.

Figure 8:
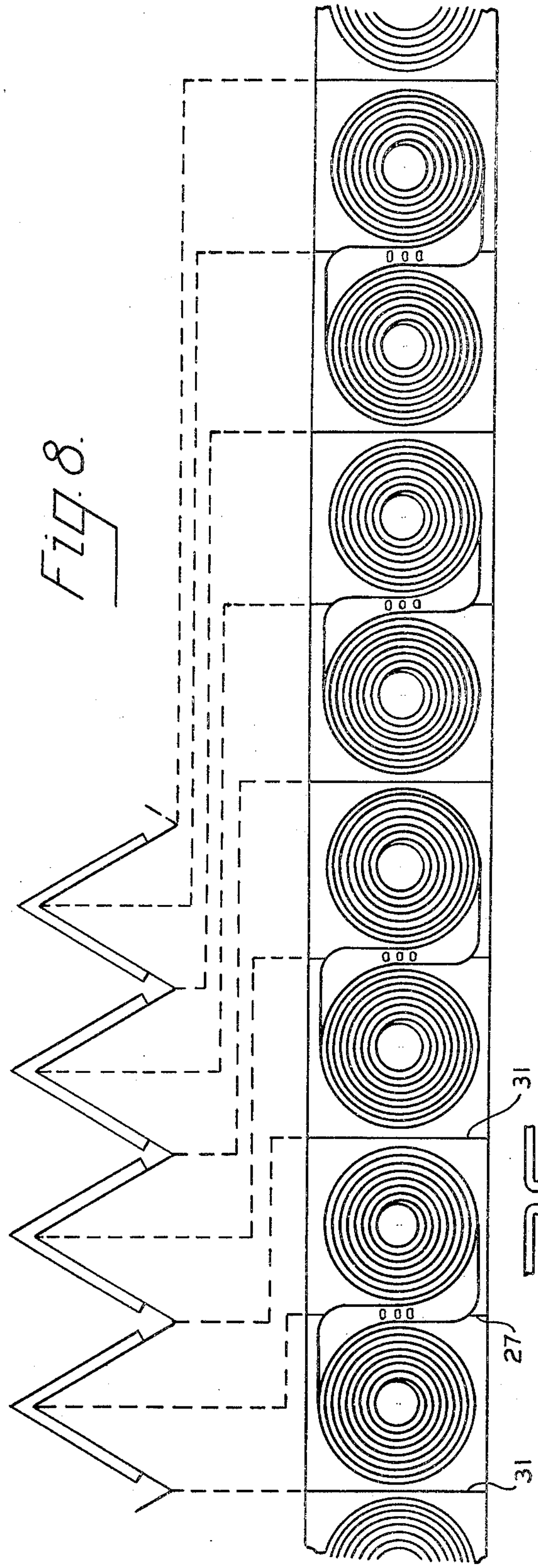
FIG. 8 is a side view illustrating location and direction of folding.
Figure 6:
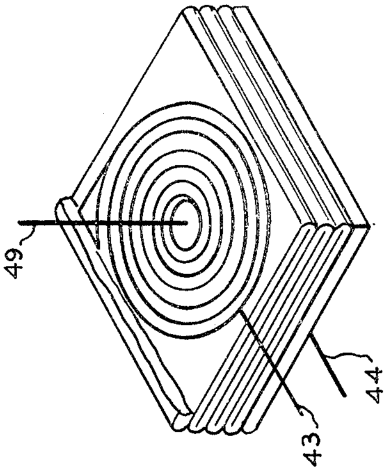
FIG. 6 is a fragmentary view in perspective of one illustrative inductor formed by this invention.

After folding the desired number of windings along the lines such as 31, FIG. 2 and FIG. 5, the folds are made along lines such as 27, FIG. 2 and FIG. 8, to create or achieve the desired number of layers and stack of windings, FIG. 6.

After the folding and welding steps, suitable terminal leads 43, 44, FIG. 6, may be applied. This step of applying the terminal leads is indicated by block 46 of FIG. 1. Also, terminal leads may be applied to the central dots intermediate the terminal windings.

The backings of the stack of windings, FIG. 6, are now heated to fuse all of the material together as indicated by block 48 of FIG. 1. Alternatively, other forms of encapsulation may be employed.

Figure 3:
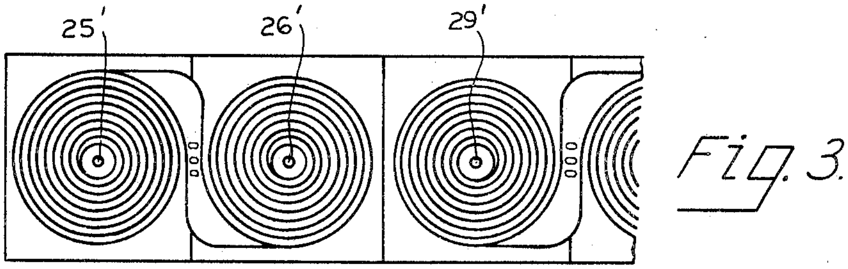
FIG. 3 is a fragmentary plan view of a portion of another illustrative embodiment of this invention.

FIG. 3 shows a fragment of an alternative embodiment of inductor in which holes are formed in the central dots 25′ 26′, 29′, to receive a suitable core 49. The core 49 may be of any convenient type well known in the art and is to be inserted in the apertured central dots as 25′, 26′, 29′, after the flexible strip 10 is folded, as shown in FIG. 6.

Figure 4:
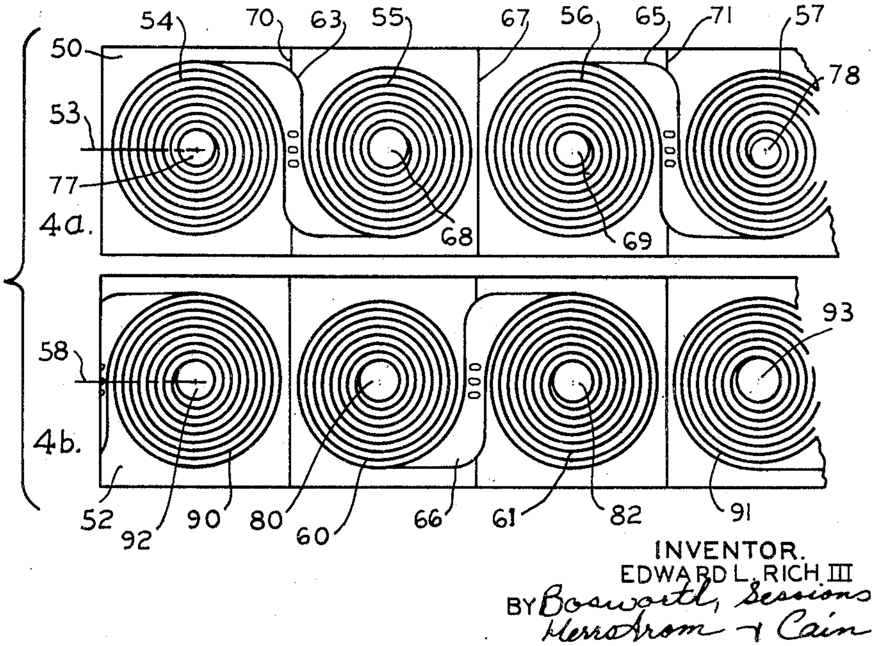
FIG. 4 is a fragmentary plan view of a printed circuit transformer according to this invention.

FIG. 4 is a plan view of the front and back sides of a flexible backing strip employed in another illustrative embodiment of this invention in which the methods previously described may be employed to produce a multiple winding inductor such as a transformer. This embodiment includes a front and a rear surface, FIG. 4, 50, 52, of a flexible substrait, respectively. On the front surface 50 is superimposed a series of pairs of windings 54, 55, 56, and 57 having their centers on a common straight line 53. On the rear shrface 52 is superimposet a series of pairs of windings 60, 61, 90, 91 having their centers on a line 58 exactly parallel to and on line 53. The most significant point with respect to this embodiment of the invention resides in the staggered relationship of the pairs of windings, or spirals, on the respective sides. For example, the conducting portions 63, 65 which connect pairs of spirals on the side 50 are spaced oppositely or alternately as compared to the conducting strip 66, connecting the spirals 60, 61. When the two sides 50, 52 are provided with this staggered relationship of pairs of spirals, they may be folded and welded to define two continuous series of spirals, one on each surface. The surface 50 is folded by moving the transverse fold line 67 away from the viewer to bring the centers 68, 69, of the spirals 55, 56, respectively, into contact with each other for welding and causing the surface 52 to be folded oppositely as compared to the surface 50. This causes the central dots 80, 82 on the opposite side, FIG. 4*b*, to be faced away from each other so that terminals may be secured thereto in a manner previously described.

Next, folds in the opposite direction are made along lines 70 and 71, FIG. 4, *a* and *b* bringing centers 82 and 93 of the windings respectively into contact with each other for welding and also bringing centers 80 and 92 of the windings respectively into contact with respect to each other for welding. This sequence of folding and contacting centers and welding is continued until the desired stack of windings is obtained. Terminals may be affixed to central dots 77, 78 of windings 54, 57, respectively, and central dots 92, 93 of windings 90, 91 or elsewhere in the stack of windings. After the folding to the desired stack it may be fused or otherwise encapsulated. This method produces a densely packed, highly efficient transformer.

Figure 7:
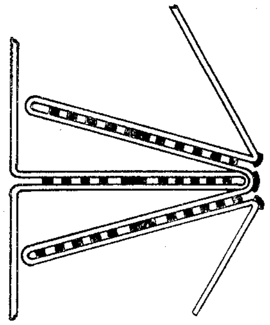
FIG. 7 is an enlarged view, in section, of portions of one illustrative embodiment of this invention.

Two separate strips as shown in FIGURES 2 or 3 may be interleaved as shown in FIG. 7.

Subsequent to this interleaving step, the folding operation may be continued until all of the windings on the insulating backing lie in a series of parallel planes in a manner similar to the embodiment shown in FIG. 6. This relationship is possible because each series of the windings is positioned in a series of separate planes as compared to the other series of windings and the interconnecting conducting strips between the pairs of windings are on opposite edges of the resulting three dimensional embodiment.

These windings and connector strips may alternatively be produced by electro-deposition as shown in FIG. 1. block 88. An example is disclosed in the article entitled, "Additive Printed Circuit Process," pages 10–12 and 14 of Electronic Packaging and Production, November 1964, and covered in U.S. Patents No. 3,033,703 and No. 3,095,309 or other prior or subsequent.

The principles of the present invention may be utilized in various ways, substitution of parts and changes in construction being resorted to as desired, it being understood that the embodiments shown in the drawings and described above and the particular methods set forth are given merely for purposes of explanation and illustration without intending to limit the scope of the claims to the specific details disclosed.

What is claimed is:

1. A printed circuit inductor including:
   a flexible backing of insulated material folded to produce a series of parallel planes,
   a series of spirals of conducting material, each terminating in a central dot, one spiral located on each plane of said flexible backing, thereby producing pairs of opposed spirals,
   means connecting opposed spirals to each other at their central dots, means connecting said pairs of spirals including a strip of conducting material extending from one plane to the next adjacent plane, and at least two terminals, each connected to one of the central dots of one of the terminal spirals.

2. A printed circuit transformer comprising:
   a flexible insulating backing strip,
   a series of pairs of conducting spirals in a first series and alternately positioned pairs of conducting spirals in a second series on said strip, each of the spirals having a central dot and having all but its central circular dot covered by a layer of insulating material, said strip being folded to produce an interleaved relationship between said first and said second series and to produce contact between the otherwise isolated central dots within each series,
   electrical conductor means connectig the contiguous spirals, and
   terminals connected to the terminal ones of the spirals of each series, said transformer being formed on a single sheet or ribbon of flexible insulating material.

3. A printed circuit transformer formed on a pair of flexible non-conducting strips,
   each strip having a series of pairs of conducting spirals thereon, each spiral having a central dot and each strip folded to produce contact between certain of said central dots, said strips being interleaved to produce an axial alignment between the central dots of all the spirals of both series;
   means connecting the contiguous dots,
   and, terminal means connected to the terminal spirals of each series.

References Cited

UNITED STATES PATENTS

| | | | |
|---|---|---|---|
| 1,647,474 | 11/1927 | Seymour | 336—200 X |
| 2,014,524 | 9/1935 | Franz | 336—200 |
| 2,911,605 | 11/1959 | Wales | 336—200 |
| 3,002,760 | 10/1961 | Shortt | 336—200 X |
| 3,011,247 | 12/1961 | Hanlet | 336—200 X |

E. A. GOLDBERG, Primary Examiner

U.S. Cl. X.R.

29—625; 336—182